United States Patent [19]

Kwasnick et al.

[11] Patent Number: 5,541,128
[45] Date of Patent: Jul. 30, 1996

[54] SELF-ALIGNED THIN-FILM TRANSISTOR CONSTRUCTED USING LIFT-OFF TECHNIQUE

[75] Inventors: Robert F. Kwasnick; George E. Possin, both of Schenectady, N.Y.

[73] Assignee: General Electric Company, Schenectady, N.Y.

[21] Appl. No.: 533,406

[22] Filed: Sep. 25, 1995

Related U.S. Application Data

[63] Continuation of Ser. No. 309,564, Sep. 20, 1994, abandoned, which is a continuation of Ser. No. 43,043, Apr. 5, 1993, abandoned.

[51] Int. Cl.$^6$ .................................................. H01L 21/86
[52] U.S. Cl. .................... 437/41; 437/40; 148/DIG. 100
[58] Field of Search ............................ 437/41, 913, 911, 437/30, TFI, 41 TFI 40; 148/DIG. 100 DIG. 1

[56] References Cited

U.S. PATENT DOCUMENTS

| 4,788,157 | 11/1988 | Nakamura | 437/101 |
| 4,862,234 | 8/1989 | Koden . | |
| 4,935,792 | 6/1990 | Tanaka et al. . | |
| 5,010,027 | 4/1991 | Possin et al. | 437/41 |
| 5,166,086 | 11/1992 | Takeda et al. | 437/41 |

FOREIGN PATENT DOCUMENTS

| 60-182134 | 9/1985 | Japan | 148/DIG. 100 |
| 62-08570 | 1/1987 | Japan | 437/41 |
| 2288237 | 11/1987 | Japan . | |
| 62-260369 | 11/1987 | Japan . | |

OTHER PUBLICATIONS

Webster's II New Riverside University Dictionary, 1984, p. 296.
Webster's II New Riverside University Dictionary, pp. 69 and 78, 1984.
K. Asama et al., "A Self–Alignment Processed a–Si TFT Matrix Circuit for LCD Panels", Fujitsu Laboratories, Ltd, Atsugi, Japan, SID Digest, 1983, pp. 144–145.
B. Diem et al., "a–Si:H TFT: Potential Suitabilities for Gate and Source–Drain Self–Aligned Structure", Mat. Res. Soc. Symp. Proc., vol. 33 (1984), pp. 281–285.
G. Possin, et al., "Contact–Limited Behavior in Amorphous–Silicon FET for Applications to Matrix–Addressed Liquid–Crystal Displays", pp. 183–189, Proc. of the SID, vol. 26/3, 1985.

Primary Examiner—Tom Thomas
Assistant Examiner—Michael Trinh
Attorney, Agent, or Firm—Marvin Snyder

[57] ABSTRACT

In the fabrication of thin-film field-effect transistors, a dielectric island is first formed over a gate and between locations where source and drain contacts are to be deposited. A dielectric cap with an overhanging brim is formed on the island. A layer of SD metal which will form the source-drain contacts is next deposited. Because of the overhang, the SD metal does not coat the entire cap, but leaves part of the cap remaining exposed and attackable by an etchant. Application of an etchant etches away the island and the cap, thereby lifting off the SD metal coated on the cap, leaving the fully-formed source and drain contacts in place, separated by the extent of the island.

4 Claims, 12 Drawing Sheets

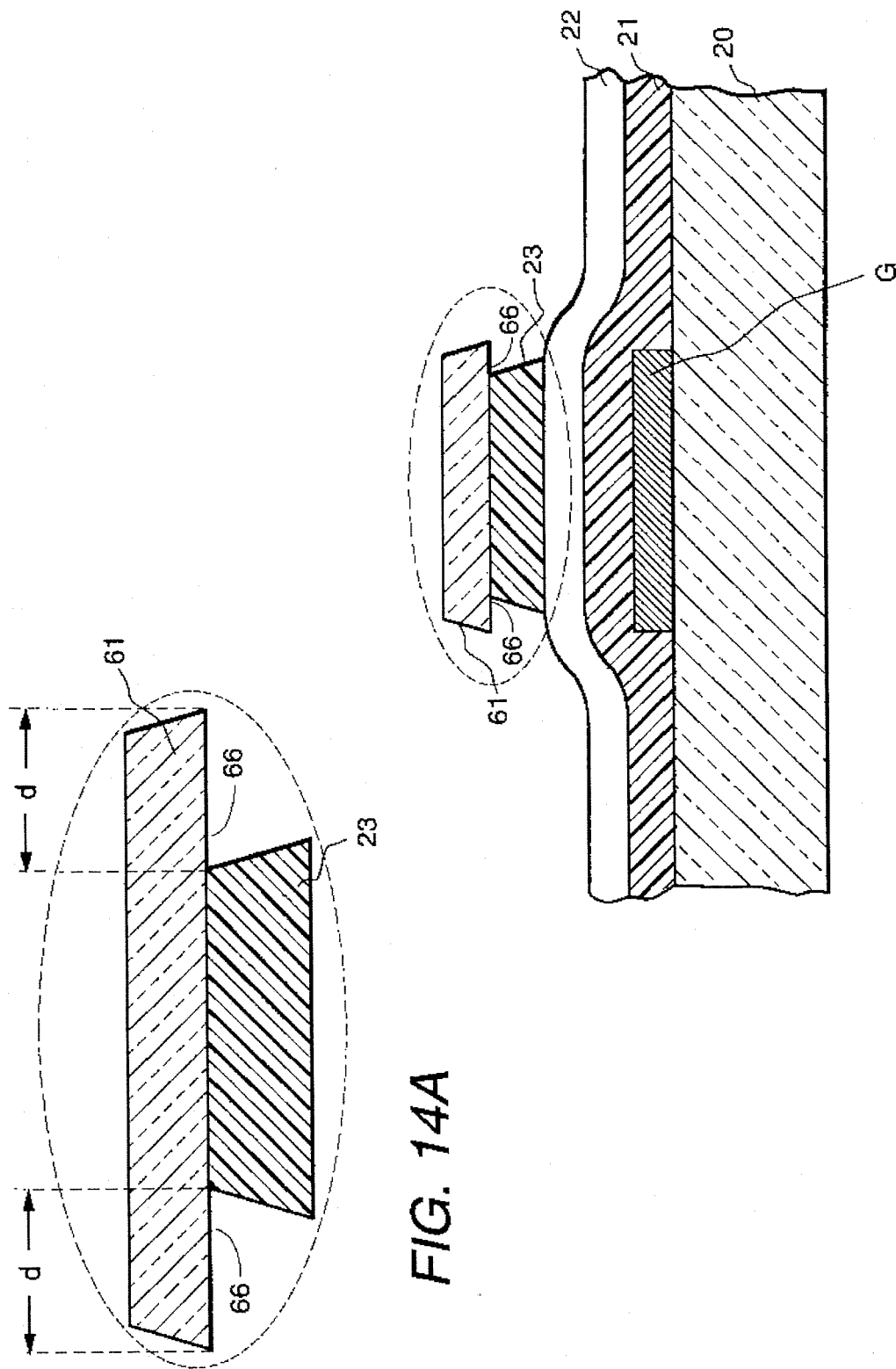

SELF-ALIGNED THIN-FILM TRANSISTOR CONSTRUCTED USING LIFT-OFF TECHNIQUE

This application is a Continuation of application Ser. No. 08/309,564 filed Sep. 20, 1994, now abandoned, which is a Continuation of application Ser. No. 08/043,043 filed Apr. 05, 1993, now abandoned.

CROSS-REFERENCE TO RELATED APPLICATIONS

This invention is related to G. Possin et al. application Ser. No. 08/024,050 filed Mar. 1, 1993 and assigned to the present assignee.

BACKGROUND OF THE INVENTION

This invention relates to the manufacture of thin-film field effect transistors and, in particular, concerns a process for patterning the source-drain contacts in such transistors.

In some types of imaging and display devices, a thin-film field-effect transistor (TFT) is associated with each pixel. The TFT must be small for several reasons. One, it consumes space within the pixel, which would otherwise be devoted to light collection or light control. Two, the TFT must be small because the pixels themselves are small; over one million pixels may be constructed on a plate measuring 8×8 inches. Three, the TFT must be small to minimize (a) the total gate capacitance, (b) the gate-to-source capacitance, and (c) the gate-to-drain capacitance.

The total gate capacitance should be small in order to reduce the total capacitance of the address line (i.e., scan line) which controls a row of TFTs in the imaging or display device. The charging time of this address line is controlled by the product of the line resistance and line capacitance. The total gate capacitance is added to the line capacitance in determining the address line charging time.

The gate-to-drain and source-to-gate capacitances should be small to minimize the coupling capacitance between the input address line, which is connected to the gate, and the imaging or display element connected to the source or drain.

PRIOR ART

In pursuit of reduced capacitances, the gate-to-drain and gate-to-source overlaps in the TFT should be kept minimal. However, it can be difficult to manufacture small TFTs in which the overlap is exactly a desired amount. One reason is that a photolithographic process is commonly used to form the source and drain. In such process, there is a typical positioning misalignment of about 2 microns or more which must be accounted for in the device layout. This amount of misalignment requires that the regions where the gate overlaps the source and drain be made larger than otherwise required, to allow for this misalignment. These enlarged sizes increase the capacitances discussed above, which is undesirable.

One approach to reducing this misalignment is found in commonly-assigned G. Possin et al. U.S. Pat. No. 5,010,027, issued Apr. 23, 1991. This patent, which discusses a self-alignment technique for constructing thin-film transistors, is hereby incorporated by reference. Another approach is found in the aforementioned G. Possin et al. application Serial No. 08/024,050, which is also incorporated by reference.

OBJECTS OF THE INVENTION

One object of the invention is to provide improvements in alignment of the source and drain contacts in the manufacture of thin-film transistors.

Another object of the invention is to provide a thin-film transistor of reduced size.

SUMMARY OF THE INVENTION

Briefly, in accordance with a preferred embodiment of the invention, during construction of a thin-film field-effect transistor, a dielectric island is formed between the source and the drain. A cap which overhangs the island is constructed. A coating of material, which will form the source and drain contacts, is next deposited. An etchant is then applied, which etches away the island, causing the material which coated the cap to lift away, leaving the source and drain contacts in place.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

FIGS. 8–14 illustrate in more detail the construction of one form of the invention;

DETAILED DESCRIPTION OF THE INVENTION

Figure 1:
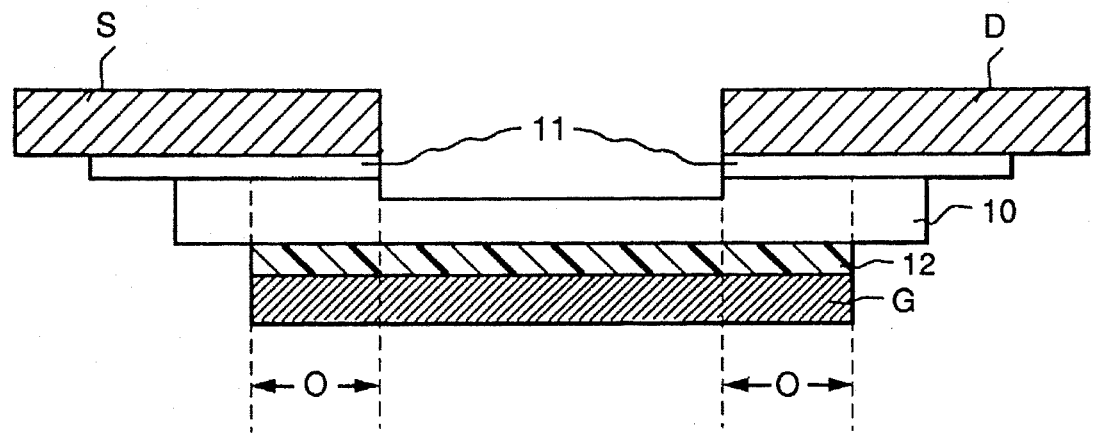
FIG. 1 is a schematic illustration of a field-effect transistor.

FIG. 1 illustrates a TFT of the type known in the art, showing an overlap O between the gate electrode G and each of the source S and drain D electrodes or contacts. The metallic source and drain electrodes are attached to the transistor semiconductor layer 10, typically of silicon, through a thin N+ silicon layer 11. The metallic gate electrode is spaced from layer 10 by a layer of insulation 12. The channel region exists in layer 10 above gate electrode G, primarily in the region not overlapped by drain and source electrodes D and S, respectively.

In pursuit of reduced capacitances, overlap O should be kept small. However, manufacture of small TFTs in which the overlap is exactly a desired amount is known to be difficult due, at least in part, to the typical positioning misalignment of about 2 microns or more resulting from the photolithographic process commonly used to form the source and drain contacts. This positioning misalignment requires that the regions where the gate electrode overlaps the source and drain contacts be made larger than otherwise necessary, to allow for the misalignment, resulting in the undesirable increases in the capacitances discussed above.

Simplified Description of the Invention

Figure 2:
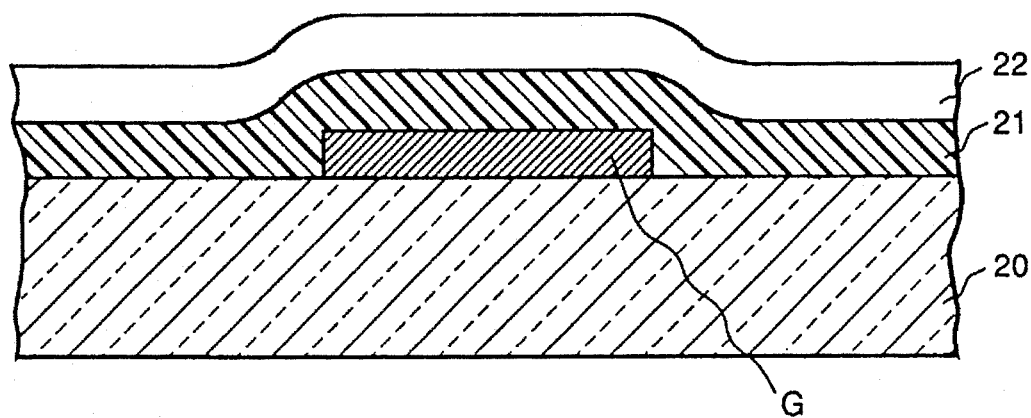
FIGS. 2–5 are a simplified representation of part of the sequence of steps used in constructing one form of the invention.
Figure 3:
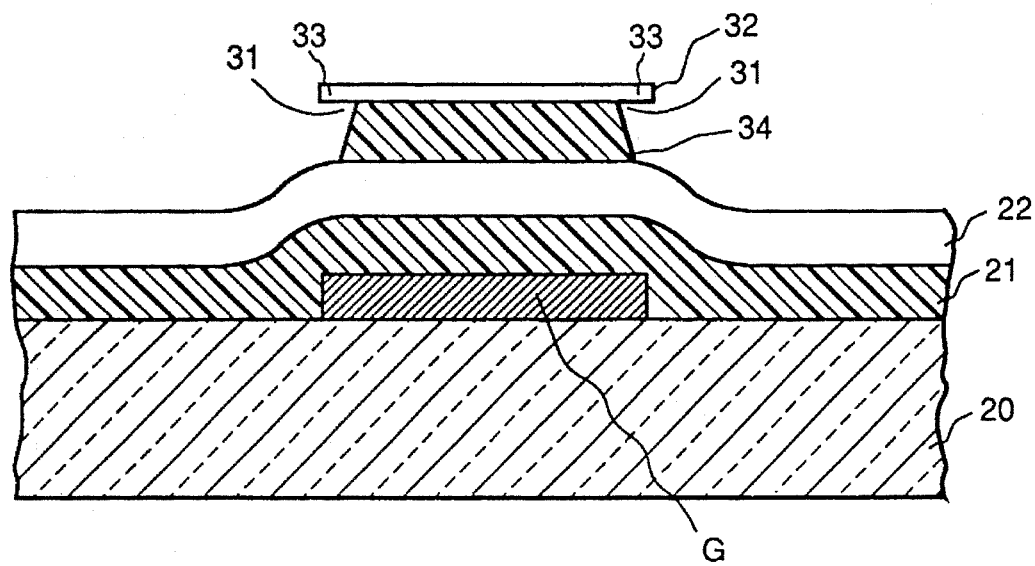

FIG. 2 shows a starting structure, which can be constructed using known techniques. The substrate (or carrier) 20 may be comprised of glass; however, other materials may be substituted therefor, provided they are sufficiently transparent to ultraviolet light in the 400 nanometer (nm) range. The gate electrode G is deposited on substrate or carrier 20, as by sputtering and is formed by conventional methods. Gate electrode G and substrate 20 are then overlaid, in sequence, by a layer of insulation 21 and a layer of silicon 22. Thereafter, as shown in FIG. 3, an island 34 is constructed from dielectric material, such as silicon nitride. The island is centered on the gate between the source and drain regions by use of a self-aligned technique, such as described in the aforementioned U.S. Pat. No. 5,010,027, in its formation. A cap 32, having a brim 33, is then formed on the island. The brim prevents material, deposited in the next step, from accumulating in region 31.

Figure 4:
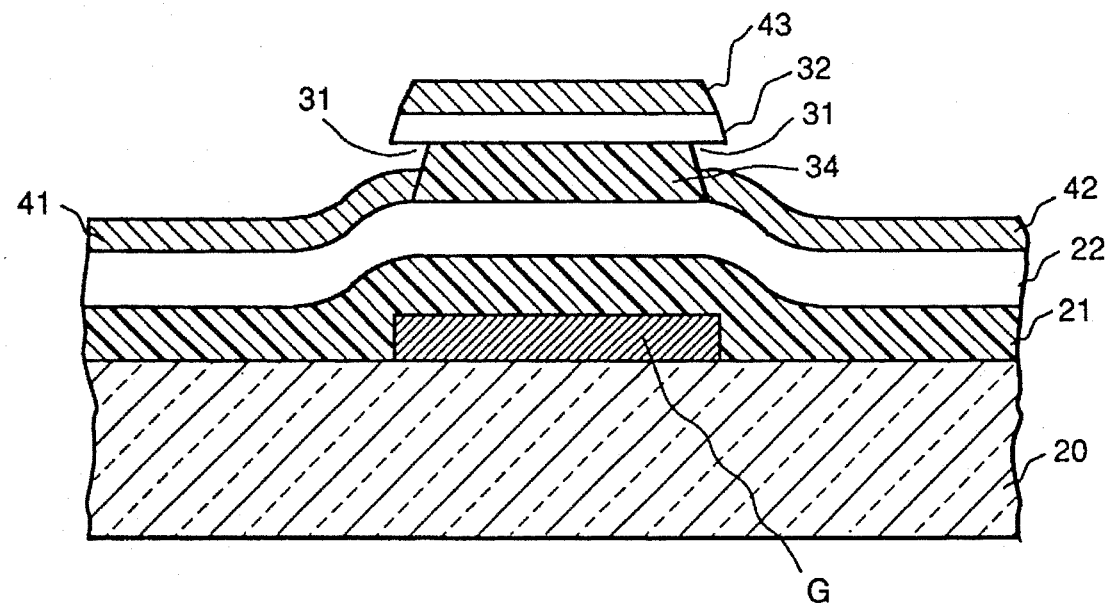
Figure 5:
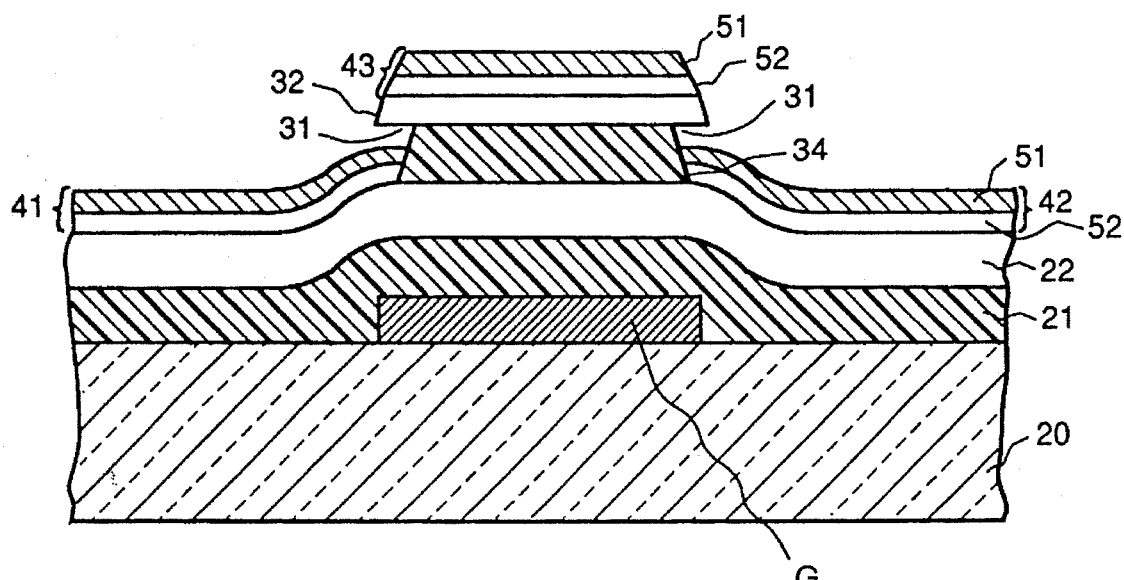

As the next step, the conductive source and drain contacts 41 and 42, respectively, are formed, as shown in FIG. 4. Although these contacts are shown as single layers, in practice they can be constructed of two layers 51 and 52 shown in FIG. 5, wherein they comprise SD metal and n+ silicon, respectively. During this step, the material forming source and drain layers 41 and 42, respectively, also accumulates as unwanted material 43 upon cap 32; however, brim 33 prevents accumulation of source and drain material in region 31.

Figure 7:
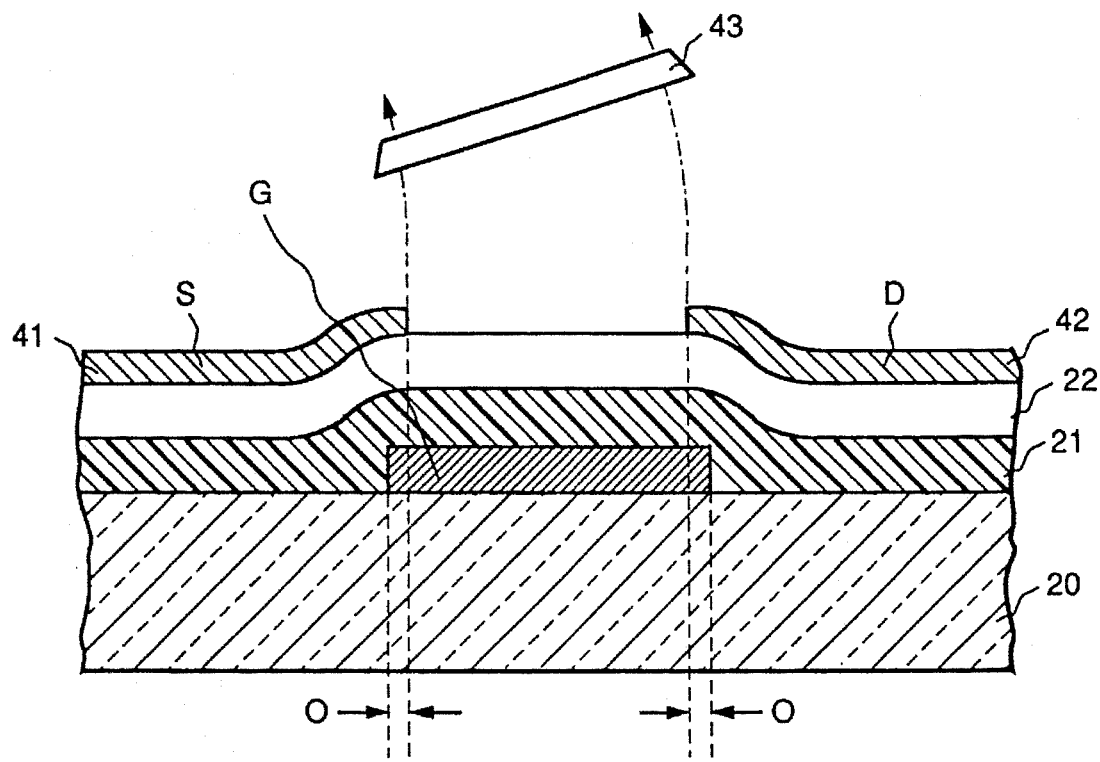
FIGS. 6 and 7 are schematic illustrations of a simplified representation of a lift-off procedure used in the invention.
Figure 6:
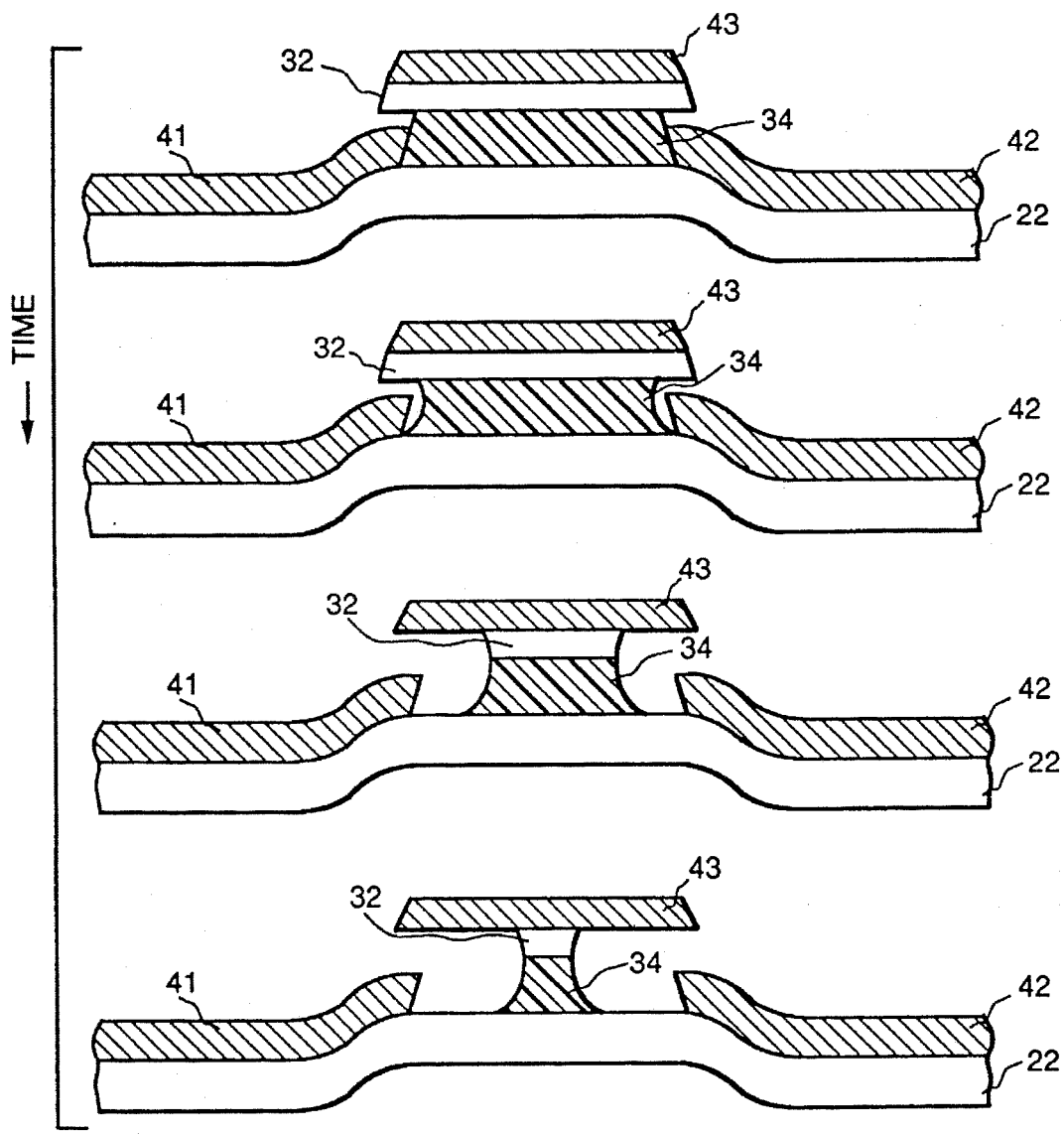

The entire structure shown in FIG. 4 is next subjected to an etch, which attacks not only cap 32, but also island 34 which is exposed in region 31, due to overhanging brim 33 of cap 32. The cap and the island both etch away, as indicated by the sequence of FIG. 6, and the unwanted material 43 eventually lifts off, as indicated by the arrows and phantom lines shown in FIG. 7, leaving an overlap O between the gate electrode and each of the source S and drain D contacts. In the resulting structure, the extents of each overlap O are equal. No masking and patterning operation is required to remove the unwanted material 43 which accumulated upon the cap. A similar result is obtained if the structure subjected to the etch is that shown in FIG. 5 instead of FIG. 4.

More Detailed Explanation of the Invention

Figure 8:
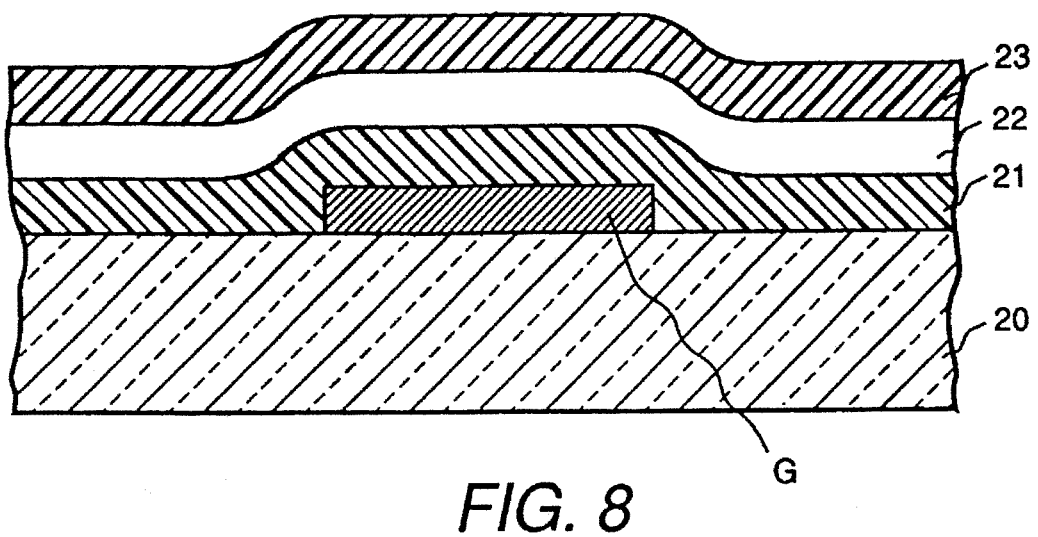

The starting structure is shown in FIG. 8 and is built up by conventional techniques. Amorphous silicon layer 22 is about 20 to 100 nm thick. Two layers of dielectric 61 and 23 (shown in FIG. 9) are then applied, each in the range of 50 to 500 nm thick. Dielectric layer 61 and 23 are of different materials.

Upper dielectric layer 61 must react much slower with the etchant used (later described) than lower dielectric layer 23. Accordingly, dielectric layer 61 can be comprised of silicon nitride having a low silicon fraction. Such silicon nitride has a low etch rate in hydrofluoric acid. Dielectric layer 23 can be also be constructed of silicon nitride, but having a high silicon fraction. Such silicon nitride has a high etch rate in hydrofluoric acid. Alternatively, layer 61 can be a nitride having a low silicon fraction, as above, and layer 23 can be an oxide of silicon.

Figure 9:
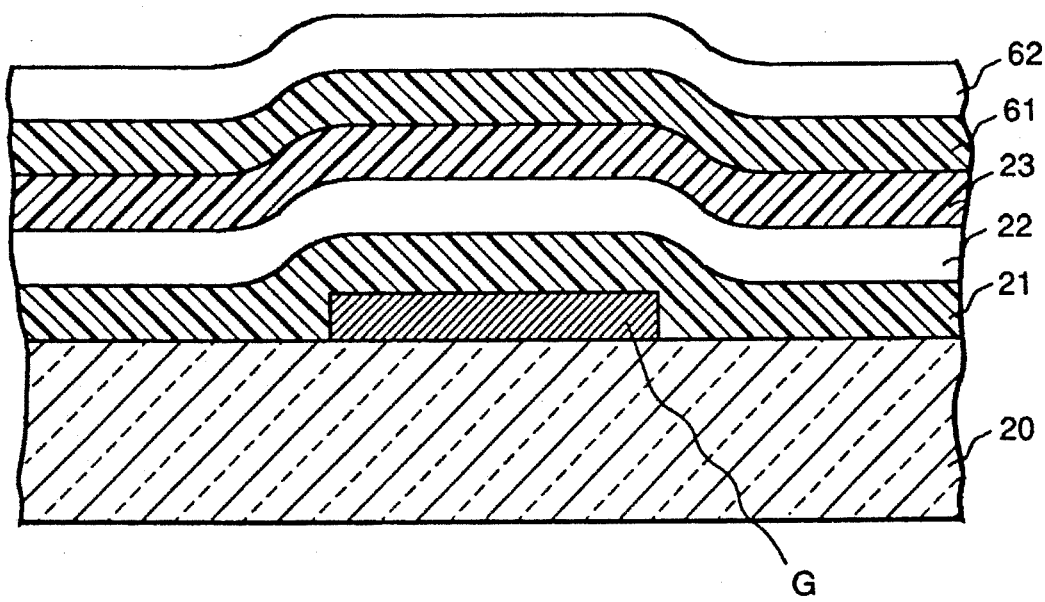
Figure 10:
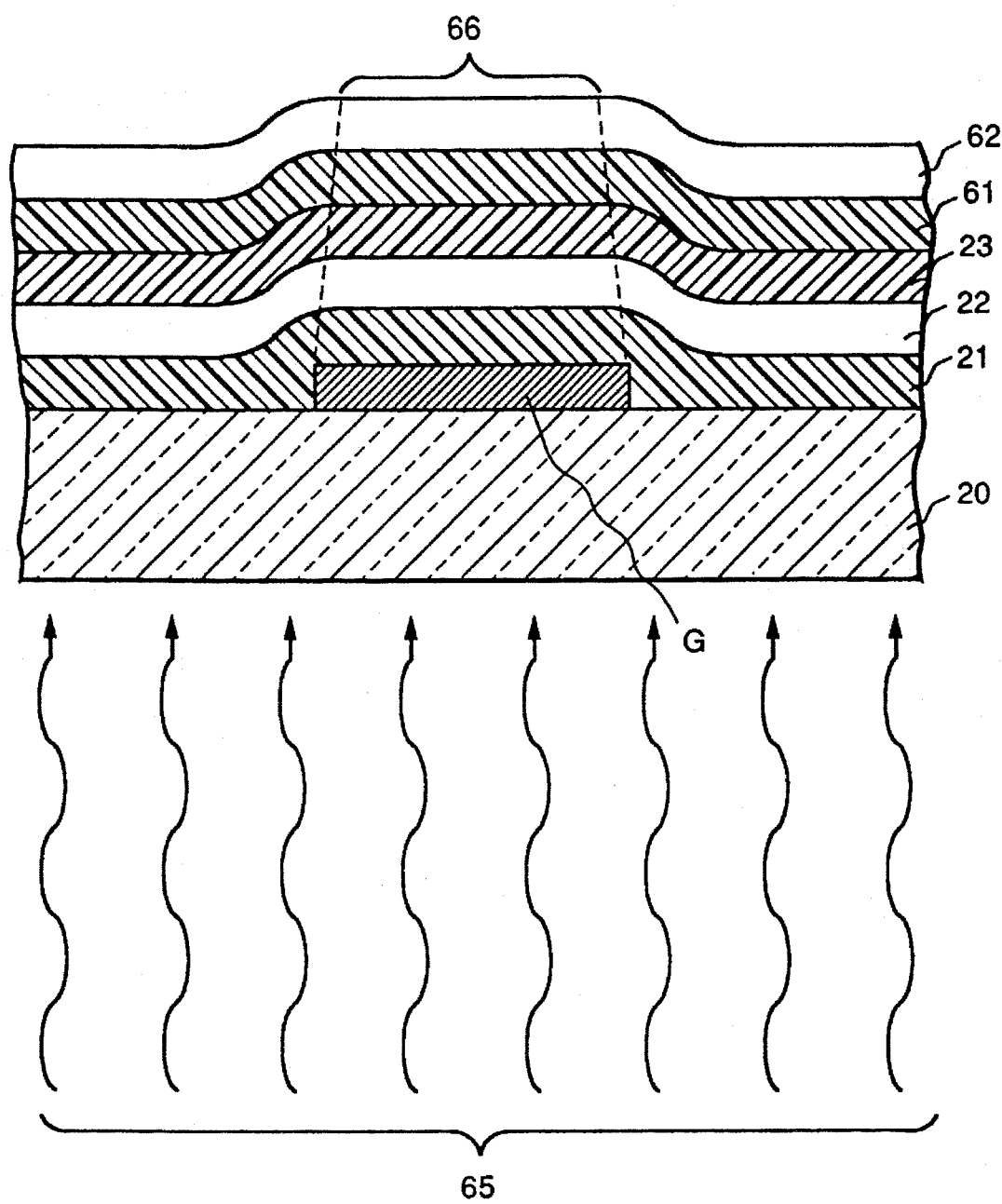

A layer of photoresist 62 is next applied, as shown in FIG. 9, and the photoresist is exposed to near ultraviolet light 65 (in the range of 400 nm), as indicated in FIG. 10. Because the light reaching the photoresist must travel through layer 22 of amorphous silicon, the exposure time must be longer than if the light reached the photoresist directly, as occurs in a front-side exposure step. For example, for a 25 nm layer of amorphous silicon, the exposure time should be about ten times longer (using light sources of comparable intensity), because the amorphous silicon attenuates the light by about 90%.

Figure 11:
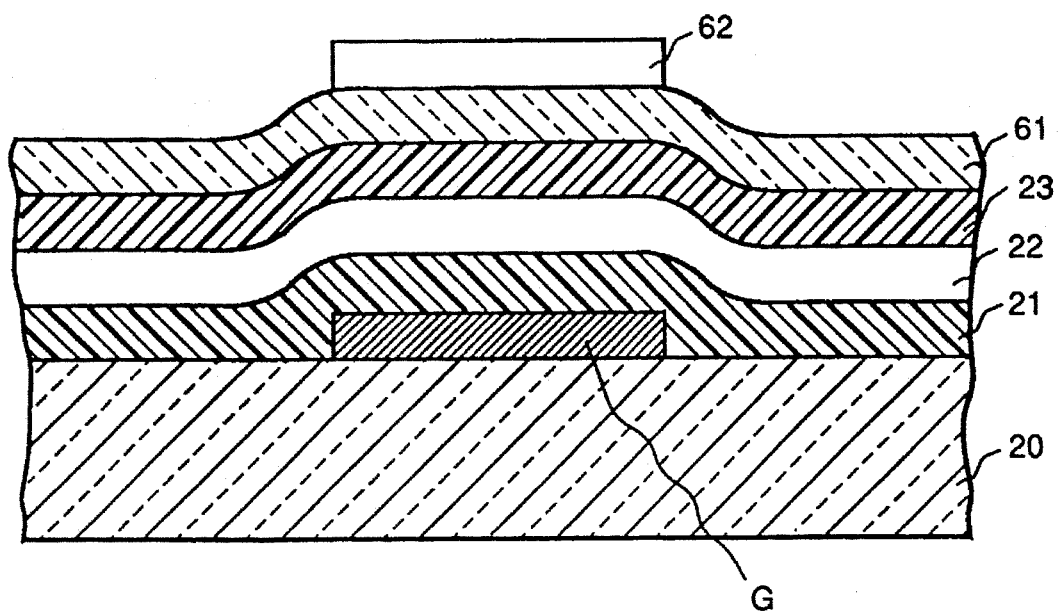

During the exposure step, gate G casts a shadow 66 upon photoresist layer 62 within the region bounded by dashed lines, as indicated in FIG. 10. The shadow ultimately creates a pattern. The photoresist is then developed, allowing the exposed photoresist to be easily removed while the shadowed (unexposed) portion remains, forming the pattern. The resulting structure is shown in FIG. 11.

Figure 12:
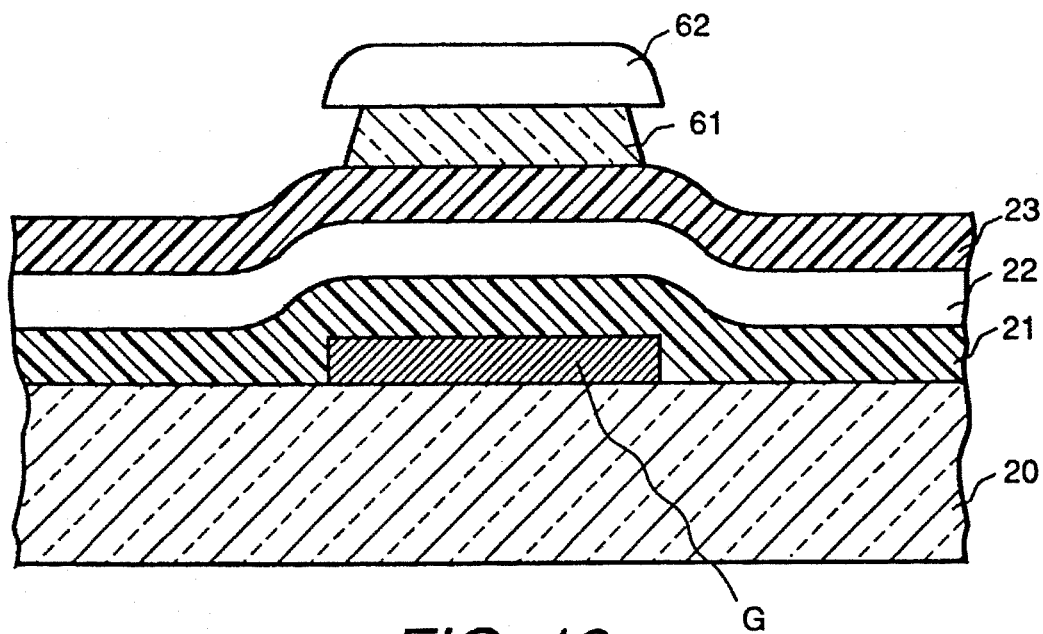
Figure 13:
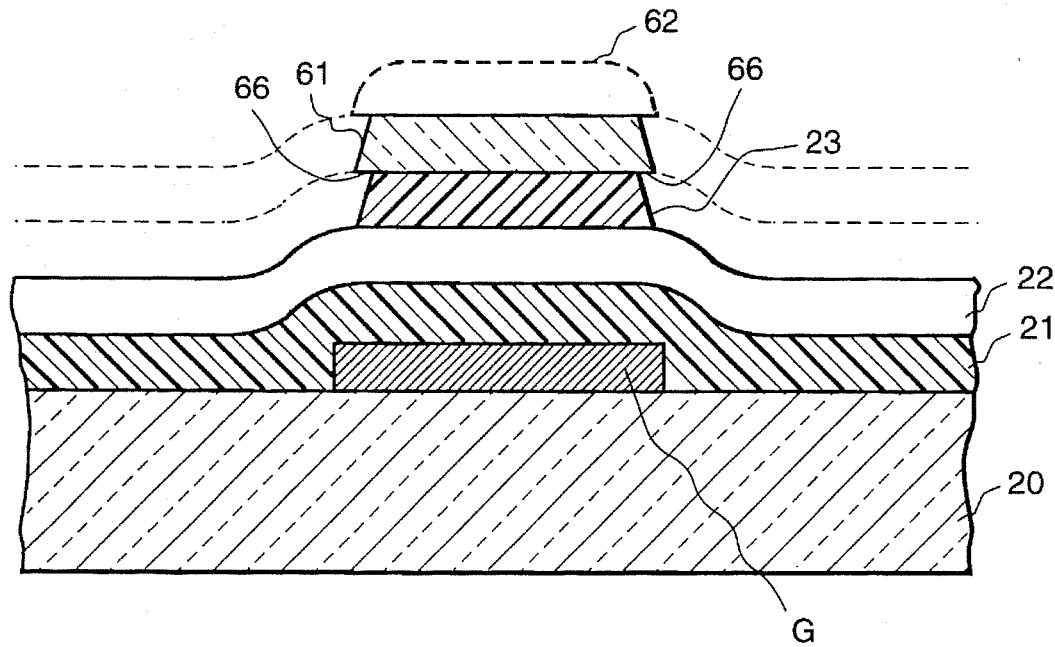

Upper dielectric layer 61 is next etched away by using, for example, 10% by volume buffered hydrofluoric acid; however, dielectric layer 61 remains where protected by the pattern, as shown in FIG. 12. Continued etching removes some of lower dielectric layer 23 located beneath upper dielectric layer 61, as shown in FIGS. 13 and 14. Dielectric layer 61 now forms a cap over an island of dielectric layer 23. The cantilevered rim of the cap forms an overhang or brim 66.

FIG. 14A shows, in greater detail (but not necessarily with correct proportions), the amount d by which cap 61 overhangs island 23. The size of overhang d should be several times the thickness of island 23. An overhang of 0.5 microns, for the representative thicknesses of layers 61 and 23 given above, can be readily achieved.

Photoresist pattern 62, shown in phantom in FIG. 13, is next stripped, and the now-exposed amorphous silicon surface is cleaned, such as by a 2.5-minute etch in 1% by volume buffered hydrofluoric acid.

Figure 15:
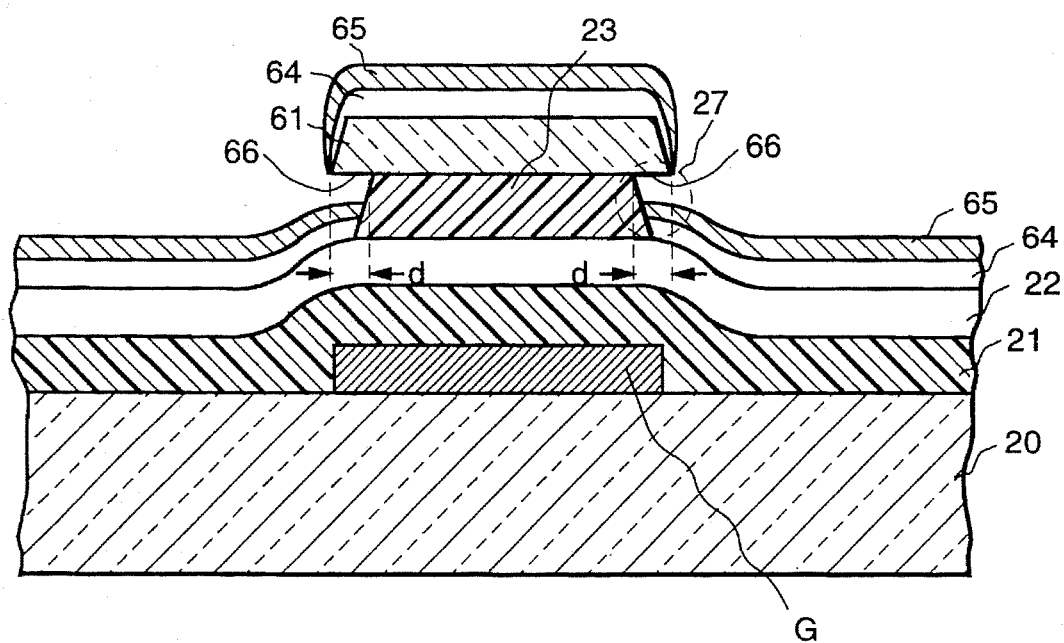
FIGS. 15 illustrates in detail a dielectric cap, its two-layer coating, and a gap which separates the coating from the cap.
Figure 15A:
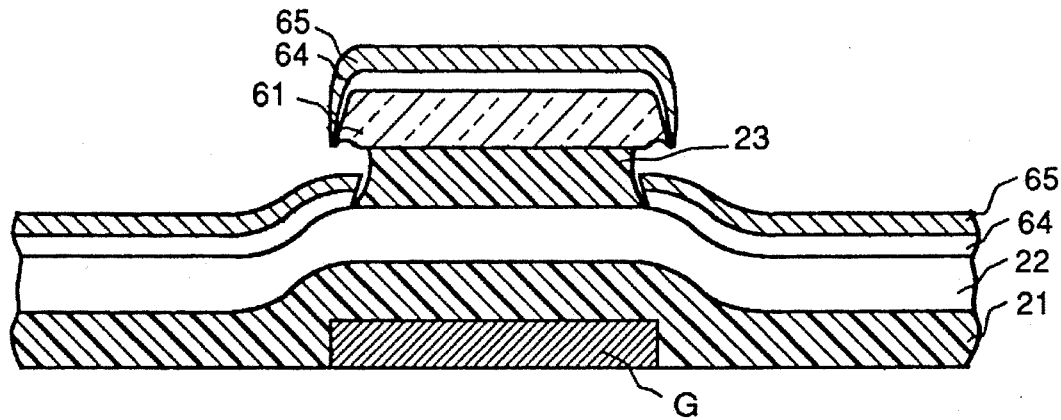
FIGS. 15A–15F illustrate in greater detail the sequence of steps used in lift-off.
Figure 15B:
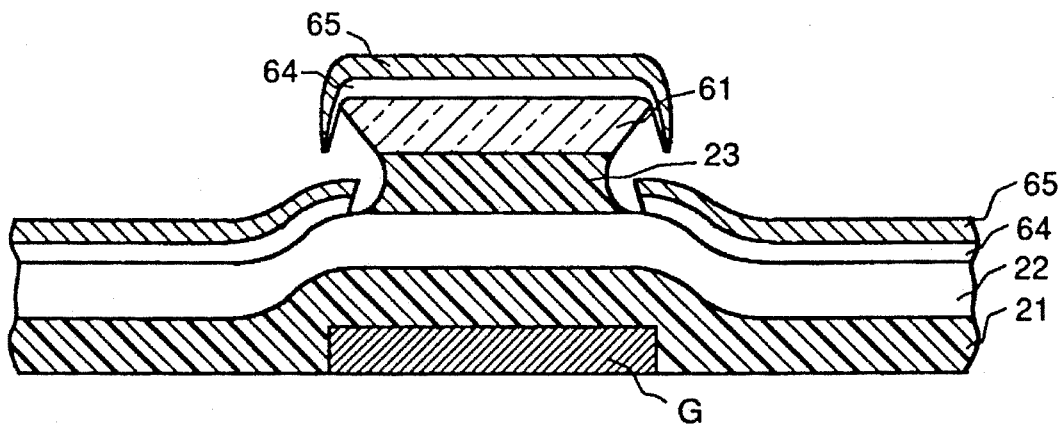
Figure 15C:
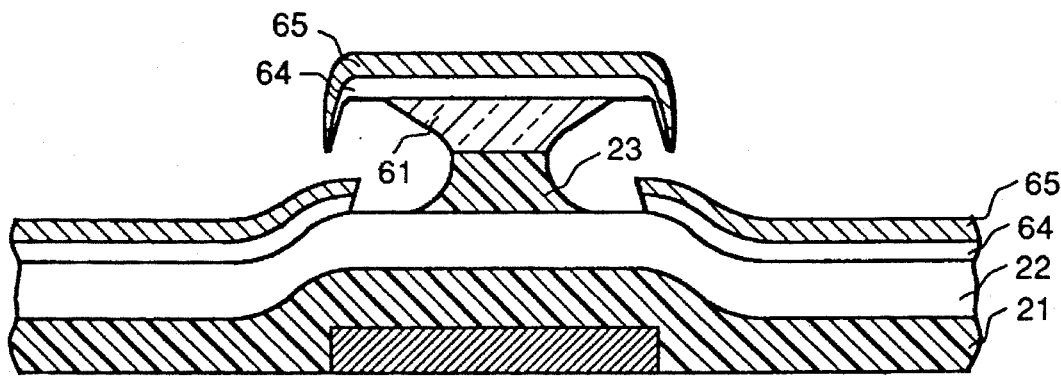
Figure 15D:
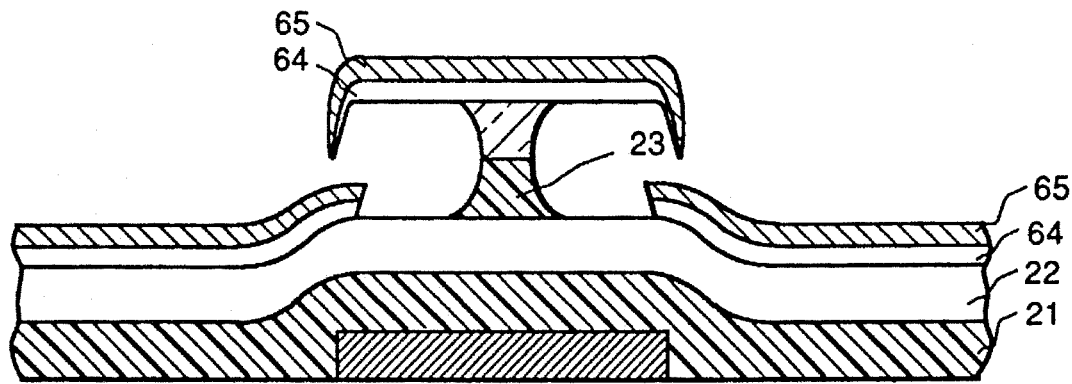

A layer of n+ amorphous silicon (or microcrystalline silicon) 64, about 10–100 nm thick, shown in FIG. 15, is then deposited by, for example, plasma enhanced chemical vapor deposition (PECVD). This is followed by deposition of a layer about 10–200 nm thick of SD metal 65, shown in FIG. 15, by sputtering or evaporation, for example.

Because brim 66 of cap 61 acts as an overhang, regions 27 are not significantly covered by amorphous silicon layer 64 and SD metal layer 65; instead, the two layers 64 and 65 deposit onto cap 61 and amorphous silicon layer 22 and are thus interrupted by a discontinuity at the sides of the cap. This discontinuity electrically disconnects the portions of layers 64 and 65 on cap 61 from layers 64 and 65 on amorphous silicon layer 22, respectively, and allows cap 61 to be attacked by etchant. However, a discontinuity in layers 64 and 65 is not strictly necessary since etchant can breach through layers 64 and 65 in region 27 if they are sufficiently thin in that region, such as in the range of 5 nanometers.

Figure 15E:
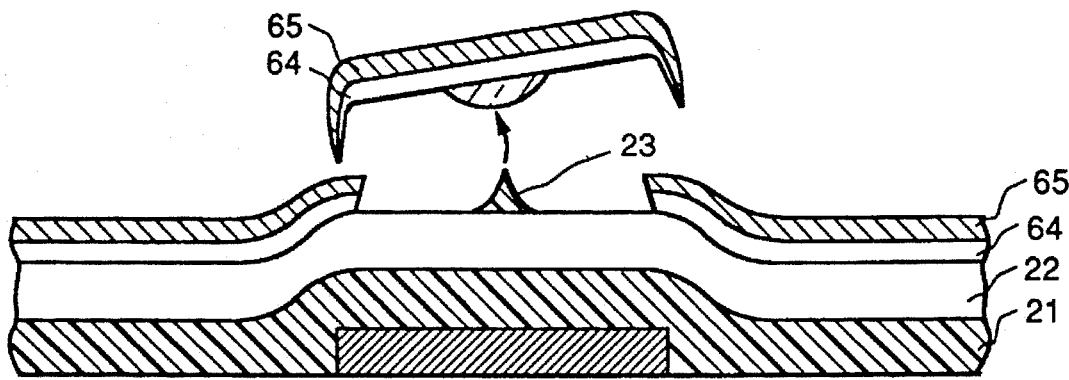

Cap 61 and island 23 are next etched away as schematically shown in the sequence of FIGS. 15A–15E, using 10% by volume hydrofluoric acid, causing the two-layer films coating cap 61 to lift off, as represented by the path indicated by the arrow shown in FIG. 15E. Ultimately, the entire cap 61 and entire island 23 are etched away by the etchant (not shown) which invades through the discontinuity in layers 64 and 65 in region 27 shown in FIG. 15. The resulting structure is shown in FIG. 15F.

Figure 15F:
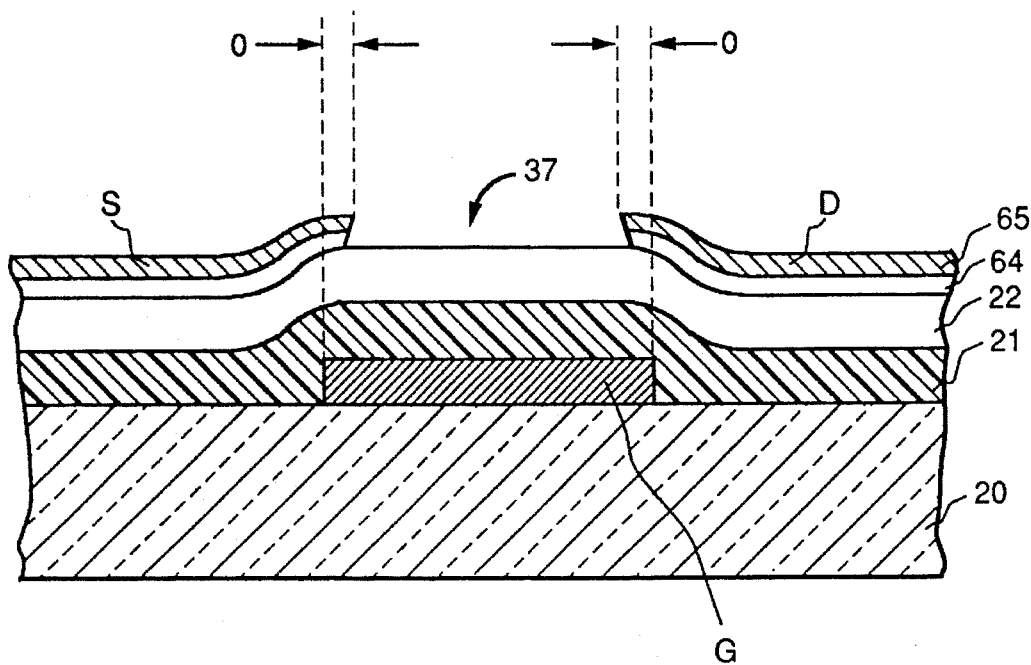
Figure 16:
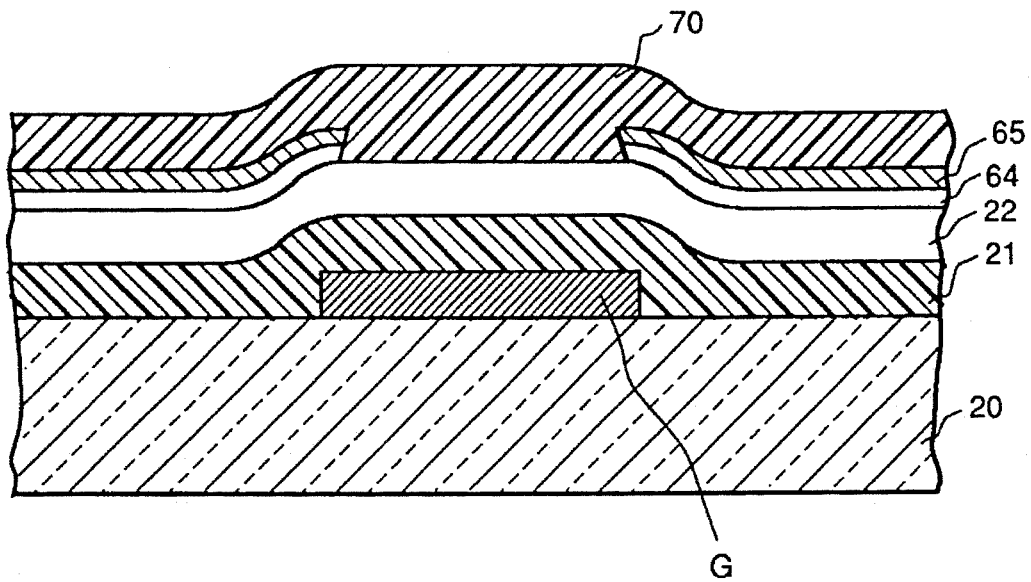
FIG. 16 illustrates a passivation layer applied to the thin-film transistor of the invention.

As shown in FIG. 15F, a well 37 now exists in the region formerly occupied by island 23. This well is then filled with a passivation layer 70, as shown in FIG. 16. Passivation layer 70 may be a polyimide, plasma-deposited silicon nitride, a silicon oxide, or silicon oxynitride. Passivation layer 70 is applied after the SD metal layer 65 is patterned into source and drain contacts S and D, respectively, shown in FIG. 15F. This patterning of SD metal layer 65 does not define the overlap O (shown in FIGS. 7 and 15F) of the source S or drain D contacts over gate G. The overlap is defined by the steps which position photoresist layer 62 shown in FIG. 11. The position and shape of photoresist layer 62 determines the overlap O by virtue of defining the location of the edges of island 23, as shown in FIGS. 13-15.

The structure shown in FIG. 16 is a precursor to the final TFT, and can be processed in a known manner to produce the TFT. The aforementioned U.S. Pat. No. 5,010,027 provides details on one such type of further processing.

Alternative Embodiments

Undercutting dielectric layer 23 so that dielectric layer 61 attains an overhang, as shown in FIG. 13, can be accomplished by reactive ion etching (RIE) in combination with wet etching. Layers 61 and 23, shown in FIG. 12, are removed by RIE down to amorphous silicon layer 22 except where protected by the overlying photoresist layer 62. A wet etch using hydrofluoric acid or buffered hydrofluoric acid is then applied and etches laterally, causing the undercut of layer 23 and resulting overhang.

RIE, however, causes damage to the amorphous silicon. For example, in RIE using $CHF_3/CO_2$ as the etchant, the etch rates of layers 61, 23 and 22 are as follows:

| Layer | Etch Rate |
| --- | --- |
| 61 (Silicon Nitride) | 21.5 nm/min |
| 23 (Oxide of Silicon) | 12.5 nm/min |
| 22 (Amorphous Silicon) | 3 nm/min |

This table indicates that erosion of the amorphous silicon layer can be expected because its etch rate is about 25 percent of that of the adjacent layer. To avoid this damage, a low power corrective etch of the outer 20 to 30 nm of amorphous silicon layer 22 is performed as a post etch. Because this corrective etch can result in excessive thinning of the amorphous silicon layer, the previous RIE of layers 61 and 23 may be timed to avoid etching the amorphous silicon, leaving the island etch to be completed by a brief wet etch.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. In the manufacture of a thin-film transistor, the process comprising the steps of:
    a) forming a gate on a carrier which is transmissive to actinic light, said gate being nontransmissive to said actinic light;
    b) forming a layer of insulator over the gate;
    c) forming a layer of amorphous silicon over the insulator;
    d) forming a first layer of silicon nitride dielectric over the amorphous silicon;
    e) forming a second layer of silicon nitride dielectric over the first layer of silicon nitride dielectric, said second layer of silicon nitride dielectric having a lower silicon fraction than said first layer of silicon nitride dielectric;
    f) forming a layer of photoresist over the second layer of dielectric;
    g) exposing the photoresist by projecting actinic light through the carrier, causing the gate to shadow the photoresist;
    h) developing the photoresist to produce a protective body which inhibits etching where the gate shadowed the photoresist;
    i) etching the second layer of dielectric, except beneath said protective body, to leave a dielectric cap having slanted sides beneath the protective body;
    j) etching the first layer of dielectric, except beneath the cap, to leave a dielectric island beneath the cap;
    k) depositing a layer of doped silicon on the amorphous silicon layer and on the cap so that the doped silicon layer is discontinuous at the edge of the cap, said layer of doped silicon on said cap being at its thinnest at a location contacting the cap at an edge thereof;
    l) depositing a layer of SD metal upon the layer of doped silicon so that the SD metal layer is discontinuous at the edge of the cap, said layer of SD metal being at its thinnest at said location where said layer of doped silicon is at its thinnest; and
    m) etching the cap and the island to cause the doped silicon and SD metal upon the cap to lift off and expose a portion of the layer of amorphous silicon.

2. The process according to claim 1, and further comprising, after step (m), the step of applying passivation dielectric onto the exposed portion of the layer of amorphous silicon.

3. In the manufacture of a thin-film transistor, the process comprising the steps of:
    a) forming a gate on a carrier which is transmissive to actinic light, said gate being nontransmissive to said actinic light;
    b) forming a layer of insulator over the gate;
    c) forming a layer of amorphous silicon over the insulator;
    d) forming a first layer of silicon nitride dielectric over the amorphous silicon;
    e) forming a second layer of silicon nitride dielectric over the first layer of dielectric, said second layer of silicon nitride dielectric having a lower silicon fraction than said first layer of silicon nitride dielectric;
    f) forming a layer of photoresist over the second layer of dielectric;
    g) exposing the photoresist by projecting actinic light through the carrier, causing the gate to shadow the photoresist;
    h) developing the photoresist to produce a protective body which inhibits etching where the gate shadowed the photoresist;
    i) etching the second layer of dielectric, except beneath said protective body, to leave a dielectric cap having slanted sides beneath the protective body;
    j) etching the first layer of dielectric, except beneath the cap, to leave a dielectric island beneath the cap;
    k) depositing a layer of doped silicon on the amorphous silicon layer and on the cap, said layer of doped silicon on said cap being at its thinnest at a location contacting the cap at an edge thereof;
    l) depositing a layer of SD metal upon the layer of doped silicon, said layer of SD metal being at its thinnest at said location where said doped silicon is at is thinnest; and m) etching the cap and the island to cause the doped silicon and SD metal upon the cap to lift off and expose a portion of the layer of amorphous silicon, the doped silicon layer and SD metal layer together being insufficiently thick to prevent etchant from reaching the cap.

4. The process according to claim 3 in which the doped silicon layer and SD metal layer together do not exceed 5 nanometers in thickness where they contact the cap at said edge thereof.

* * * * *